United States Patent [19]

Kuo

[11] Patent Number: 6,125,921
[45] Date of Patent: Oct. 3, 2000

[54] RADIATOR

[75] Inventor: Dah-Chyi Kuo, Taipei, Taiwan

[73] Assignee: Chaun-Choung Industrial Corp., Taipei, Taiwan

[21] Appl. No.: 09/270,730

[22] Filed: Mar. 16, 1999

[51] Int. Cl.[7] .................................. F28F 7/00; H05K 7/20
[52] U.S. Cl. ..................... 165/80.3; 165/185; 361/695; 361/709
[58] Field of Search .................. 165/185, 80.3; 361/678, 690, 695, 704, 709, 710

[56] References Cited

U.S. PATENT DOCUMENTS

| | | | |
|---|---|---|---|
| 4,884,631 | 12/1989 | Rippel | 165/185 |
| 4,926,935 | 5/1990 | Haushalter | 165/185 |
| 5,201,866 | 4/1993 | Mok | 165/80.3 |
| 5,309,983 | 5/1994 | Bailey | 165/80.3 |
| 5,375,655 | 12/1994 | Lee | 165/185 |
| 5,528,456 | 6/1996 | Takahashi | 361/704 |
| 5,706,169 | 1/1998 | Yeh | 361/690 |
| 5,771,966 | 6/1998 | Jacoby | 165/185 |
| 5,791,406 | 1/1998 | Gonner et al. | 165/185 |
| 5,940,269 | 8/1999 | Ko et al. | 361/697 |

*Primary Examiner*—Ira S. Lazarus
*Assistant Examiner*—Tho Duong
*Attorney, Agent, or Firm*—Rosenberg, Klein & Lee

[57] ABSTRACT

A radiator at least comprises a seat and a heat dissipating body. The seat have a receiving space; and the heat dissipating body is formed by a plurality of top portions, middle portions and bottoms which are connected continuously as a bending grid. A vent is installed on the top portion of the heat dissipating body. The heat dissipating body is compressed so that the top portions and the bottoms are closely contacted with one another as a plurality of continuously contacting planes. The compressed heat dissipating body is received within the receiving space of the seat and the heat dissipating body is properly combined to the seat. Thereby, the radiator of the present invention has preferred heat transfer efficiency and since the heat dissipating body is compressed, thus it has a higher density which is helpful in the heat dissipation.

7 Claims, 5 Drawing Sheets

RADIATOR

BACKGROUND OF THE INVENTION

1. Field of the Invention

The present invention relates to a radiator, and especially to a radiator having a preferred heating transfer and having a higher density so as to have a good heat dissipating ability.

2. Background of the Invention

The radiator is a necessary element in a semiconductor chip. A chip combining with a radiator will increase the heating dissipation so that the speed and lifetime of the chip can be increased.

As shown in FIG. 1, the prior art radiator includes a seat 10a and a heat dissipating body 11a. The seat 10a is a plate made of aluminum material. The heat dissipating body 11a is a thin plate of aluminum and then is bent to from as a plurality of continuous rectangular shapes and form as grids. The heat dissipating body 11a can be adhered to the seat 10a by welding and sticking. As a result, a radiator is formed and than can be assembled to a chip for increasing heat dissipating. The radiator can be combined with a fan for further increasing heat dissipating. One of this kind radiator is disclosed in Taiwan Patent No. 339865.

However, since in the prior art radiator, the top portions and the bottoms of the radiator has not connected continuously, that is, openings are formed between different plates of the heat dissipating body. Therefore, the heat transfer is bad, and further, since the area for heat dissipating is smaller, the heat dissipating efficiency is low.

SUMMARY OF THE INVENTION

Accordingly, the object of the present invention is to provide a radiator at least comprising a seat and a heat dissipating body. The seat have a receiving space; and the heat dissipating body is formed by a plurality of top portions, middle portions and bottoms which are connected continuously as a bending grid. A vent is installed on the top portion of the heat dissipating body. The heat dissipating body is compressed so that the top portions and the bottoms are closely contacted with one another as a plurality of continuously contacting planes. The compressed heat dissipating body is received within the receiving space of the seat and the heat dissipating body is properly combined to the seat. Thereby, the radiator of the present invention has preferred heat dissipating efficiency and since the heat dissipating body is compressed, thus it has a higher density which is helpful in the heat dissipation.

The present invention will be better understood and its numerous objects and advantages will become apparent to those skilled in the art by referencing to the following drawings in which:

DETAILED DESCRIPTION OF THE PREFERRED EMBODIMENT

Figure 1:
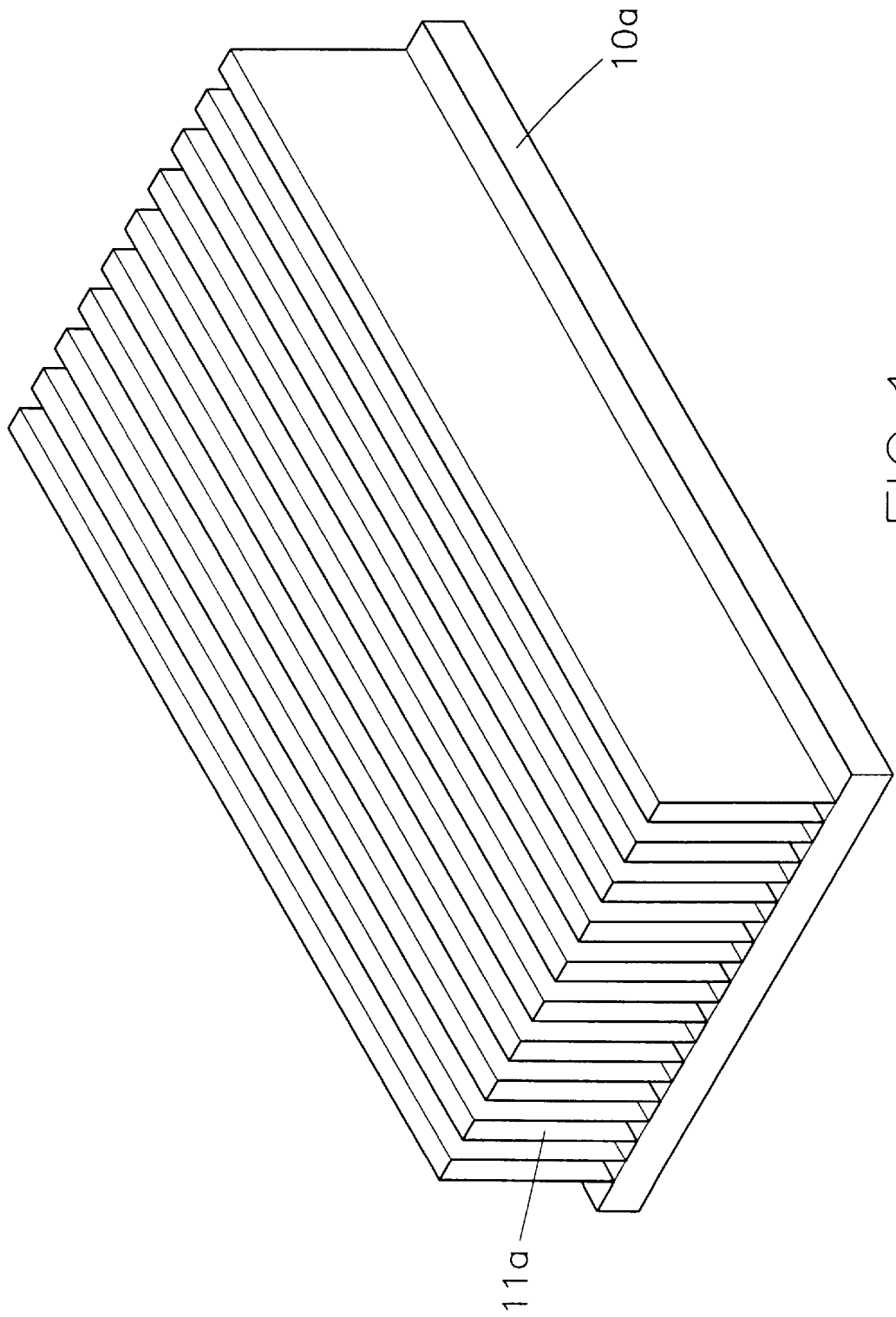
FIG. 1 is a perspective view of a prior art radiator.
Figure 2:
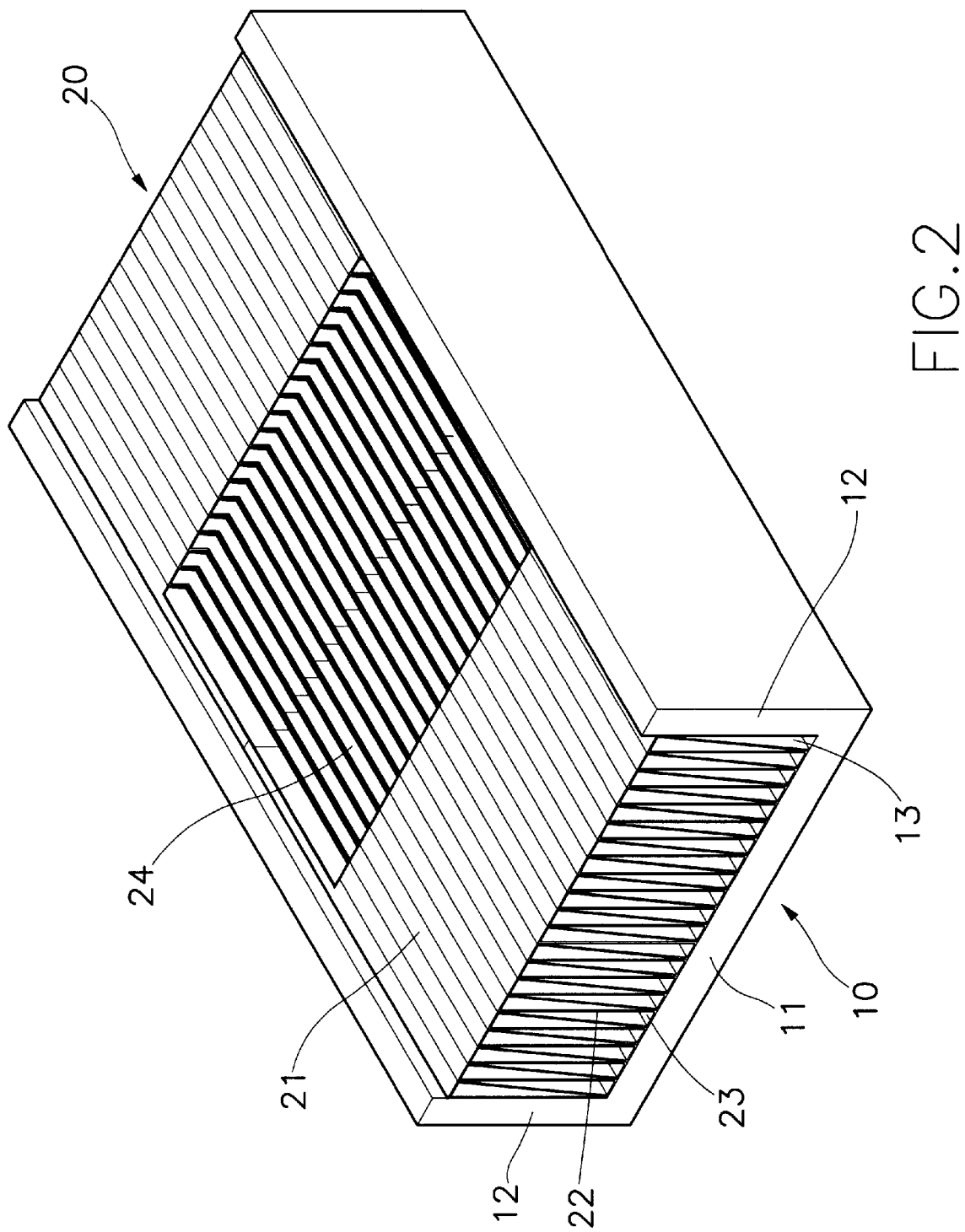
FIG. 2 is a perspective view of the present invention.
Figure 3:
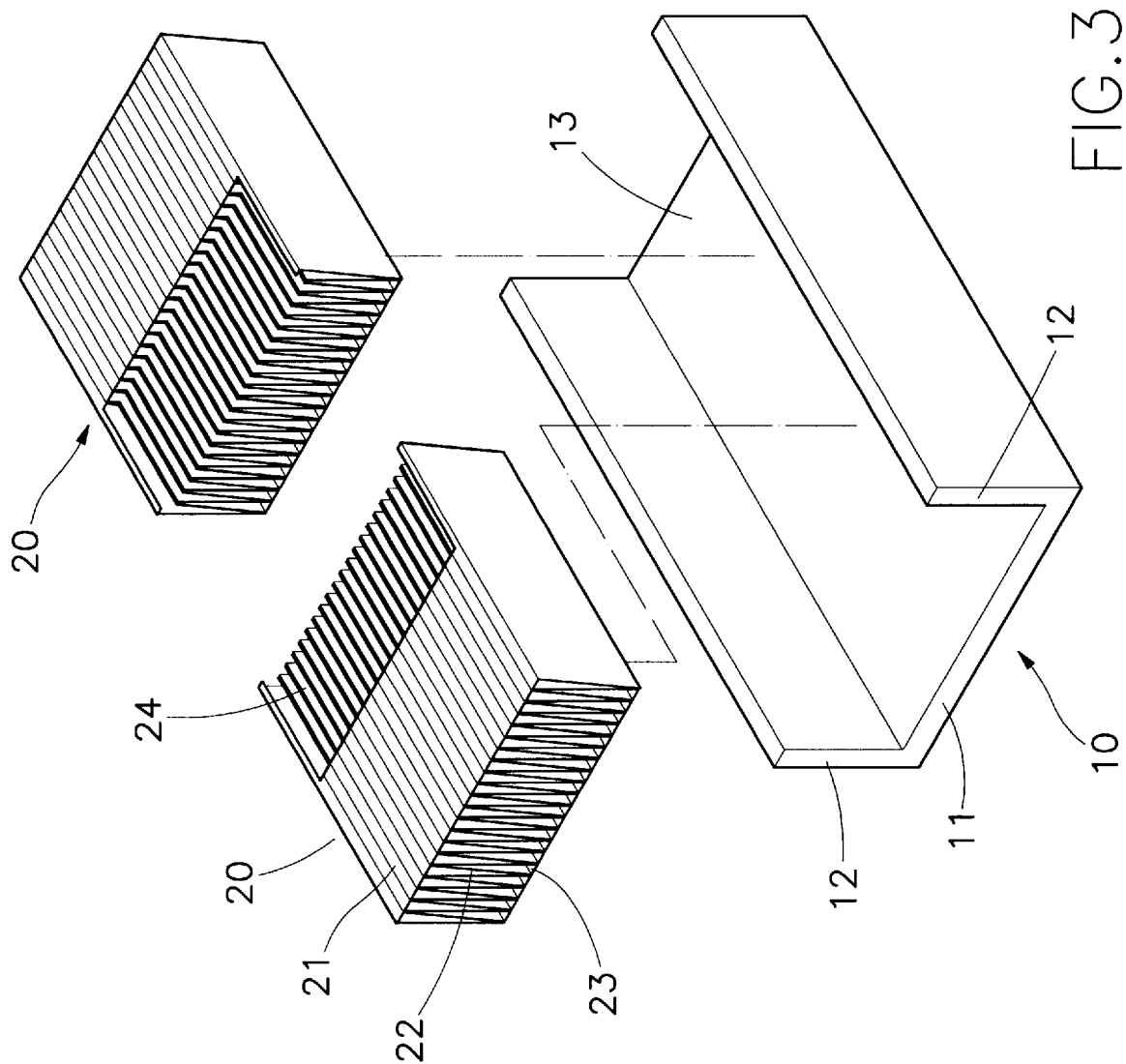
FIG. 3 is an exploded view of the present invention.
Figure 4:
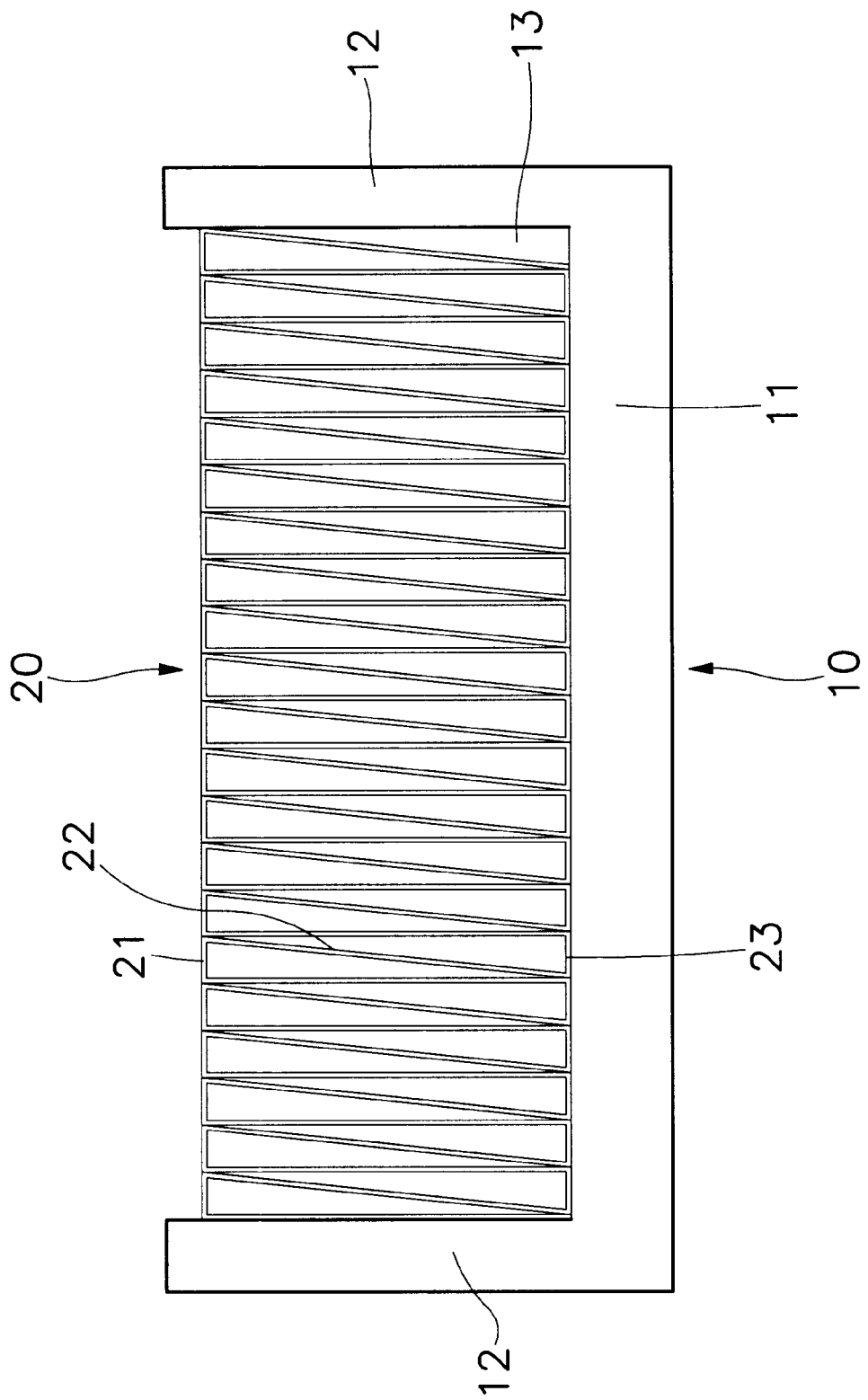
FIG. 4 is a plan view of the present invention.

With reference to FIGS. 2, 3 and 4, the receiving space of the present invention is illustrated. The radiator is formed by a seat 10 and heat dissipating bodies 20. The seat 10 is made of aluminum or other material with good conductivity and has a U shape. The seat 10 is formed by connecting integrally a bottom plate 10 with two lateral plates 12 on the left and right sides of the bottom plate 11. A receiving space 13 is formed between the two lateral plates 12 and above the bottom plate 11 for receiving the heat dissipating body The heat dissipating body 20 is originally a thin piece formed of aluminum or other material with good conductivity 20. In this embodiment, two heat dissipating bodies 20 are installed. The heat dissipating body is bent as a continuous rectangular shape so as to be formed as a plurality of hollow grid piece. Thus, the heat dissipating body 20 is formed by a plurality of connected top portions 21, middle portions 22, and bottoms 23.

The top portion 21 is parallel to the bottom 23, The top portion 21 and the bottom 23 are connected to the top end and two sides of the lower end of the middle portion 22, respectively. Then, compressing the heat dissipating body 20, the top portions of the heat dissipating body will tightly contact with one another, and also the bottom of the heat dissipating body tightly contact with one another. The top portions and bottoms are connected continuously. The compressed heat dissipating body 20 has a width approximately equal to the width of the receiving space 13 of the seat 10, and thus the heat dissipating body 20 can be received within the receiving space 13 of the seat 10. The height of the heat dissipating body 20 is slightly lower then the height of the receiving space 13 of the seat 10. Further, a vent is installed on the top portion 21 of the heat dissipating body 20 so that air can flow therethrough. The bottom 23 and the two sides of the heat dissipating body 20 can be adhered to the seat 10 by welding or sticking.

Figure 5:
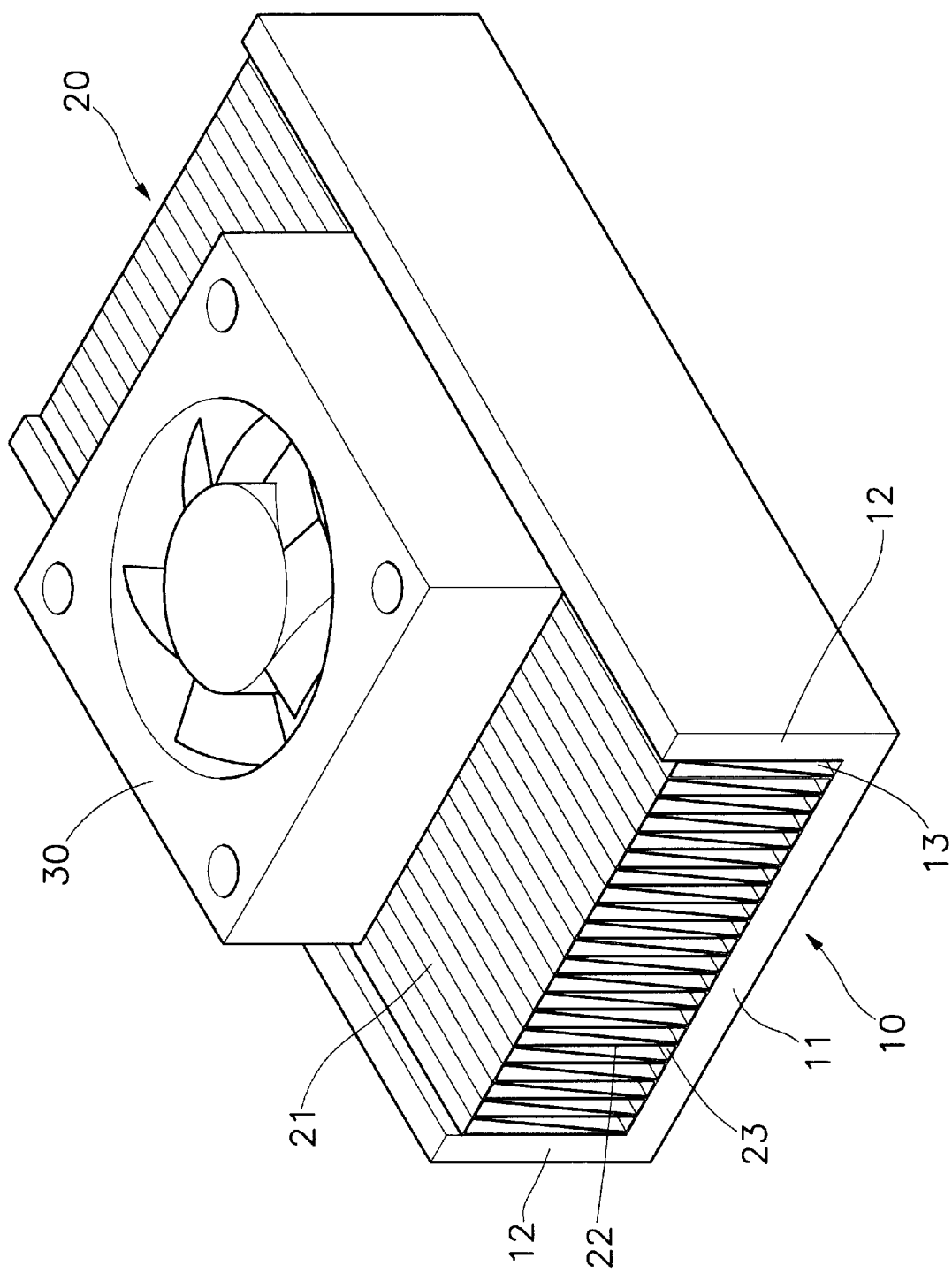
FIG. 5 is a perspective view of the present invention with a fan.

Another, as shown in FIG. 5, a fan 30 can be properly connected to the radiator for further dissipating heat. The fan 30 is mounted on the top portion 21 of the heat dissipating body 20 and is respective to the vent 24. The fan 30 is located between the two lateral plates 12 of the two seats 10 and is fixed properly.

In the present invention, the heat dissipating body 20 is compressed properly so that the top portions 20, bottoms 23 and upper and lower ends of the middle portions 22 of the heat dissipating body 20 may tightly contact with one another in order to has a preferred heat transfer. Especially, the tight contact in the bottoms 23 of the heat dissipating body 20 will increase the contact area between the heat dissipating body 20 and the seat 10 so as to have a preferred heat transfer. Moreover, since the heat dissipating body 20 is compressed, thus it has a higher density so as to have a large heat dissipation effect.

In summary, from the aforementioned description, it is appreciated that the present invention has a good heat dissipating efficiency by the design of compactness and high integrating density of material. Therefore, some defects in the prior art have been improved. Although the invention has been described in detail with reference only to a preferred embodiment, those skilled in the art will appreciate that various modifications can be made without departing from the invention. Accordingly, the invention is defined only by the following claims which are intended to embrace all equivalent thereof.

Description of the Numerals in FIGS.

| | | | |
|---|---|---|---|
| 10 | seat | 11 | bottom plate |
| 12 | lateral plate | 13 | receiving space |
| 20 | heat dissipating body | 21 | top portion |
| 22 | middle portion | 23 | bottom |
| 24 | vent | 30 | fan |
| 10a | seat | 11a | heat dissipating body |

What is claimed is:

1. A heat dissipation system comprising:
   (a) a seat having a bottom plate and a pair of lateral plates extending therefrom to define a receiving space; and,
   (b) at least one heat dissipating body having a corrugated configuration received in said seat receiving space, said heat dissipating body having formed therein a plurality of adjacent sections, said sections each including: substantially planar top and bottom portions and a middle portion extending transversely therebetween, said top portions of said adjacent ones of said sections being disposed in contact one with the other, said middle portions of adjacent ones of said sections being spaced one from the other by an air passage, said top portion of at least one of said sections being disposed in partially overlaid manner over said middle portion extending therefrom to maintain a vent in open communication with at least one said air passage.

2. The heat dissipation system as recited in claim 1 comprising a plurality of said heat dissipating bodies received in said seat receiving space, said vents of a pair of said heat dissipating bodies being in open communication one with the other.

3. The heat dissipation system as recited in claim 1 wherein said bottom and lateral plates of said seat form a substantially U-shaped sectional contour.

4. The heat dissipation system as recited in claim 1 wherein said heat dissipating body is disposed in recessed manner within said seat.

5. The heat dissipation system as recited in claim 1 wherein said top and bottom portions of each said heat dissipating body section are disposed in substantially parallel manner, said bottom portions contacting said bottom plate of said seat in substantially flush manner.

6. The heat dissipation system as recited in claim 1 wherein said heat dissipating body is fixedly secured to said seat.

7. The heat dissipation system as recited in claim 1 further comprising a fan coupled to said heat dissipating body, said fan communicating with said vent of said heat dissipating body.

* * * * *